US008703529B2

(12) United States Patent
Chen et al.

(10) Patent No.: US 8,703,529 B2
(45) Date of Patent: Apr. 22, 2014

(54) FABRICATING METHOD OF LIGHT EMITTING DEVICE AND FORMING METHOD OF ORGANIC LAYER

(75) Inventors: Eng-Jay Chen, Miaoli County (TW); Chou-Chin Weng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/421,884

(22) Filed: Mar. 16, 2012

(65) Prior Publication Data
US 2013/0130422 A1 May 23, 2013

(30) Foreign Application Priority Data

Nov. 23, 2011 (TW) .............................. 100142901 A

(51) Int. Cl.
*H01L 51/40* (2006.01)
*H01L 21/00* (2006.01)
*H01L 51/00* (2006.01)
*H01L 51/50* (2006.01)

(52) U.S. Cl.
CPC ......... *H01L 51/0003* (2013.01); *H01L 51/0021* (2013.01); *H01L 51/5056* (2013.01); *H01L 51/5072* (2013.01)
USPC ........... 438/99; 438/22; 438/46; 257/E51.022

(58) Field of Classification Search
USPC .................................. 438/22–47; 257/79–103
See application file for complete search history.

(56) References Cited

U.S. PATENT DOCUMENTS

| 6,982,179 | B2 * | 1/2006 | Kwong et al. ................... 438/22 |
| 7,455,886 | B2 * | 11/2008 | Rao et al. .................... 427/385.5 |
| 2005/0067949 | A1 | 3/2005 | Natarajan et al. |
| 2005/0186106 | A1 * | 8/2005 | Li et al. .......................... 420/500 |
| 2006/0088728 | A1 * | 4/2006 | Kwong et al. ................. 428/690 |
| 2008/0042131 | A1 * | 2/2008 | Morimoto et al. ............... 257/59 |
| 2009/0184635 | A1 * | 7/2009 | Pan et al. ....................... 313/504 |
| 2011/0163300 | A1 * | 7/2011 | Meng et al. ..................... 257/40 |
| 2011/0175064 | A1 * | 7/2011 | Kim et al. ....................... 257/40 |
| 2012/0049164 | A1 * | 3/2012 | Inbasekaran et al. ........... 257/40 |
| 2012/0097934 | A1 * | 4/2012 | Sung et al. ...................... 257/40 |
| 2012/0143568 | A1 * | 6/2012 | Kagan et al. .................. 702/189 |
| 2012/0273736 | A1 * | 11/2012 | James et al. ............. 252/519.21 |
| 2012/0299045 | A1 * | 11/2012 | Pan et al. ........................ 257/98 |

* cited by examiner

*Primary Examiner* — Seahvosh Nikmanesh
*Assistant Examiner* — Evren Seven
(74) *Attorney, Agent, or Firm* — Jianq Chyun IP Office

(57) ABSTRACT

A fabricating method of a light emitting device is provided. In the fabricating method, a substrate having a first electrode layer is provided. An organic film solution that includes an organic material, a solid medium, and a solvent is provided. The solid medium is capable of sublimation, and the organic material and the solid medium are mixed into the solvent. An organic film is formed on the first electrode layer by using the organic film solution. The solvent and the solid medium are removed to form an organic functional layer that has the organic material. A second electrode layer is formed on the organic functional layer.

15 Claims, 7 Drawing Sheets

FABRICATING METHOD OF LIGHT EMITTING DEVICE AND FORMING METHOD OF ORGANIC LAYER

CROSS-REFERENCE TO RELATED APPLICATION

This application claims the priority benefit of Taiwan application serial no. 100142901, filed Nov. 23, 2011. The entirety of the above-mentioned patent application is hereby incorporated by reference herein and made a part of this specification.

BACKGROUND OF THE INVENTION

1. Field of the Invention

The invention relates to a fabricating method of a device and a forming method of a film. More particularly, the invention relates to a fabricating method of a light emitting device and a forming method of an organic layer.

2. Description of Related Art

An electroluminescent device is a semiconductor device capable of efficiently converting electrical energy into optical energy, and the organic electroluminescent device often serves as a light emitting device of indicator light, a display panel, and an optical pickup head. Since an organic electroluminescent device is characterized by the absence of viewing-angle dependence, simple manufacturing process, low costs, high response speed, wide operating temperature range, and full-color display, the organic electroluminescent device satisfies the requirement for the multi-media display and is likely to become a mainstream of the next generation flat panel display.

The organic electroluminescent device includes an anode, an organic light emitting layer, and a cathode. In order for the organic electroluminescent device to emit light, holes and electrons are injected into the organic light emitting layer respectively through the anode and the cathode. The electrons and the holes are re-combined in the organic light emitting layer to form photons, such that light is emitted. To enhance the light emitting efficiency of the organic electroluminescent device, a hole injection layer and a hole transporting layer are often configured between the anode and the organic light emitting layer, and an electron injection layer and an electron transporting layer are often configured between the cathode and the organic light emitting layer. Namely, there can be a plurality of organic functional layers between the anode and the cathode, and the organic functional layers may be a hole injection layer, a hole transporting layer, an organic light emitting layer, an electron injection layer, and an electron transporting layer sequentially stacked on the anode.

The organic functional layers are often formed by performing an evaporation process with use of a mask, which is however not cost-effective and is rather inapplicable to mass production. Hence, other techniques, e.g., a printing process, are proposed to replace the mask-using evaporation process. In the printing process, an organic material is dissolved into a volatile solvent to form a solution, and the solution containing the organic material is coated onto the substrate. After that, the solvent is evaporated to form the organic functional layer containing the organic material. Nonetheless, the organic functional layers are stacked and in contact with one another; therefore, the solvent for subsequently forming the organic functional layers may be in contact with the organic functional layers that are already formed, and the formed organic functional layers may be dissolved into the solvent, which further poses an impact on the device properties of the organic electroluminescent device. Since the organic functional layers have various types of materials, fabrication of the organic functional layers becomes much more difficult and complicated.

SUMMARY OF THE INVENTION

The invention is directed to a fabricating method of a light emitting device which can simplify the fabrication of an organic functional layer.

The invention is further directed to a forming method of an organic layer which includes simple fabricating steps.

In the invention, a fabricating method of a light emitting device is provided and includes following steps. A substrate having a first electrode layer is provided. A first organic film solution that includes a first organic material, a first solid medium, and a first solvent is provided. The first solid medium is capable of sublimation, and the first organic material and the first solid medium are mixed into the first solvent. A first organic film is formed on the first electrode layer by using the first organic film solution. The first solvent and the first solid medium are removed to form a first organic functional layer having the first organic material. A second electrode layer is formed on the first organic functional layer.

In the invention, a forming method of an organic layer is provided and includes following steps. An organic film solution that includes an organic material, a solid medium, and a solvent is provided. The solid medium is capable of sublimation, and the organic material and the solid medium are mixed into the solvent. A substrate is coated with the organic film solution to form an organic film on the substrate. The solvent is removed from the organic film to form a solid film. The solid medium in the solid film is sublimated to form an organic functional layer having the organic material.

Based on the above, in the invention, the organic film solution that contains the organic material, the solid medium capable of sublimation, and the solvent is employed to form the organic film. After the solvent and the solid medium are removed, the organic functional layer having the organic material or the organic layer having the organic material is formed. Thereby, fabrication of the organic functional layer or the organic layer is simplified, and a device (e.g., a light emitting device) having the organic functional layer or the organic layer has desirable device properties.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

First Embodiment

Figure 1A:
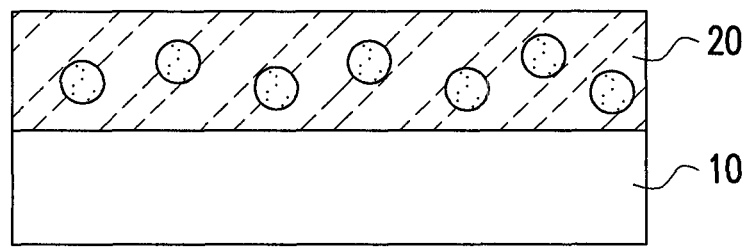
FIG. 1A to FIG. 1C are schematic cross-sectional flow charts illustrating a forming method of an organic layer according to a first embodiment of the invention.
Figure 1B:
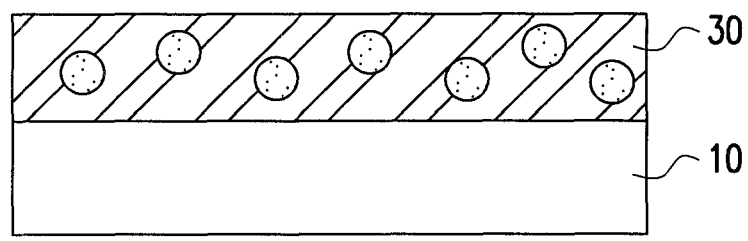
Figure 1C:
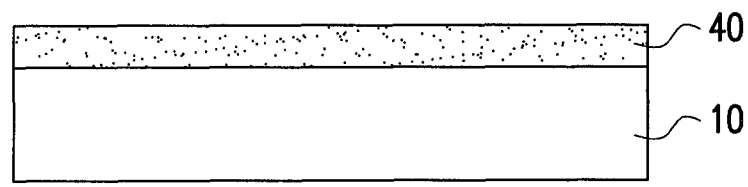

FIG. 1A to FIG. 1C are schematic cross-sectional flow charts illustrating a forming method of an organic layer according to a first embodiment of the invention. In the forming method, an organic film solution that includes an organic material, a solid medium, and a solvent is provided. The solid medium is capable of sublimation, and the organic material and the solid medium are mixed into the solvent. In the present embodiment, the organic material is determined based on the desirous organic layer. For instance, the organic layer may be an organic functional layer in a light emitting device, a photo-electrical conversion layer in a solar cell, or any other organic layer. Hence, the appropriate organic material is determined based on the required properties of the film layers.

In the present embodiment, the solid medium is naphthalene, aluminium acetylacetonate ($Al(acac)_3$), or any other solid medium capable of sublimation, for instance. In the present embodiment, a sublimation temperature of the solid medium is lower than a tolerance temperature of the organic material, for instance, so as to protect the properties of the organic material from being negatively affected by the temperature at which the solid medium is subsequently removed. The solvent is an organic solvent with volatility, such as tetrahydrofuran, dichloromethane, toluene, acetone, or any other appropriate solvent. Here, a volatile temperature (e.g., the boiling temperature) of the solvent is lower than the sublimation temperature of the solid medium. Specifically, the volatile temperature of the solvent under the atmospheric pressure ranges from 40° C. to 80° C., for instance.

With reference to FIG. 1A, an organic film solution is coated onto a substrate 10 to form an organic film 20 on the substrate 10. The substrate 10 may be an organic substrate or an inorganic substrate. In this embodiment, a method of coating the substrate 10 with the organic film solution includes a spin coating method, an inkjet method, or any other appropriate method.

With reference to FIG. 1B, the solvent is removed from the organic film 20 to form a solid film 30. The solid film 30 includes an organic material and a solid medium. According to the present embodiment, the ratio of the organic material to the solid medium is 1:5~1:200, preferably 1:100, for instance. Besides, in the present embodiment, a method of removing the solvent is, for instance, evaporation of the solvent, such as performing a heating process, changing the pressure, or evaporating the solvent in other ways based on the properties of the solvent. Here, the temperature at which the heating process is performed is determined by a volatile temperature of the solvent. For instance, the heating process under the atmospheric pressure is performed at the temperature ranging from 40° C. to 80° C. Certainly, the solvent may also be removed by changing the pressure or modifying other conditions based on the properties of the solvent.

With reference to FIG. 1C, the solid medium in the solid film 30 is sublimated to form an organic functional layer 40 having the organic material. In the present embodiment, a method of sublimating the solid medium may include performing a heating process on the solid film 30, for instance. The temperature at which the heating process is performed is determined by a sublimation temperature of the solid medium, e.g., from 70° C. to 200° C. In other embodiments, the solid medium may also be sublimated by changing the pressure or modifying other conditions based on the properties of the solid medium.

According to the present embodiment, the organic layer having the organic material is formed by forming the organic film (containing the organic material, the solid medium, and the solvent) on the substrate and sequentially removing the solvent and the solid medium from the organic film. Since the organic material, the solid medium, and the solvent are mutually dissolvable, and the solvent and the solid medium may be easily removed, the forming method of the organic layer is characterized by simple steps and low manufacturing costs. Moreover, by properly selecting the organic material, the solid medium, and the solvent that are mutually dissolvable, the forming method of the organic layer described in the present embodiment may be broadly applied to the fields of semiconductor, photo-electricity, and so on. Thereby, the device having the organic layer made by the forming method can have favorable device properties.

A fabricating method of a light emitting device to which the above-mentioned forming method is applied is discussed below to further elaborate the invention.

Second Embodiment

Figure 2A:
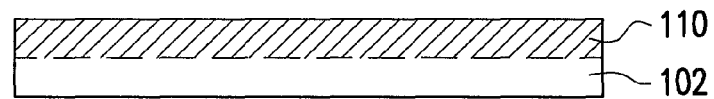
FIG. 2A to FIG. 2E are schematic cross-sectional flow charts illustrating a fabricating method of a light emitting device according to a second embodiment of the invention.

FIG. 2A to FIG. 2E are schematic cross-sectional flow charts illustrating a fabricating method of a light emitting device according to a second embodiment of the invention. With reference to FIG. 2A, a substrate 102 having a first electrode layer 110 is provided. In the present embodiment, the substrate 102 may be a rigid substrate or a flexible substrate. The rigid substrate is, for instance, a glass substrate, a rigid plastic substrate, a metal substrate, a wafer, or a ceramic substrate; the flexible substrate is, for instance, an organic substrate, such as a polyimide (PI) substrate, a polycarbonate substrate, a polyethylene terephthalate (PET) substrate, a poly(ethylene 2,6-napthalate) (PEN) substrate, a polypropylene substrate, a polyethylene substrate, a polystyrene substrate, any other appropriate substrate, a substrate formed with the above polymer derivates, or a thin metal or alloy substrate.

According to the present embodiment, the first electrode layer 110 is formed on the substrate 102, for instance. Here, the first electrode layer 110 is an anode, for instance, and may be made of a transparent conductive material or a non-transparent conductive material. Besides, the first electrode layer 110 may have a single-layer structure or a multi-layer structure. The transparent conductive material may include metal oxide, such as indium tin oxide (ITO), indium zinc oxide (IZO), aluminum tin oxide (ATO), aluminum zinc oxide (AZO), indium germanium zinc oxide, other suitable oxide (e.g., zinc oxide), or a stacked layer having at least two of the above materials. The non-transparent conductive material includes metal, such as silver, aluminum, molybdenum, copper, titanium, or any other appropriate metal. In the present embodiment, a method of forming the first electrode layer 110 is, for instance, an evaporation method, a coating method, a deposition method, or any other appropriate method.

A first organic film solution that includes a first organic material, a first solid medium, and a first solvent is provided. The first solid medium is capable of sublimation, and the first organic material and the first solid medium are mixed into the first solvent. In this embodiment, the first organic film solution is made on the conditions of normal temperature, atmospheric pressure, and little water vapor. The ratio of the first organic material to the first solid medium is 1:5~1:200, preferably 1:100, for instance. The ratio of the solid content of the first organic material to the solid content of the first solid medium in the first organic film solution is 10%~20%, for instance.

In the present embodiment, the first organic film solution is used to Rum the organic light emitting layer, for instance; therefore, the first organic material is, for instance, a material of an organic light emitting layer, such as a phosphorous material derived from a phosphor material in a singlet excited state or in a triplet excited state. The phosphorous material is able to emit blue light, green light, red light, yellow light, or white light. However, the invention is not limited thereto. In other embodiments, the first organic film solution may also be used to form a hole injection layer, a hole transporting layer, an electron injection layer, or an electron transporting layer. Hence, the first organic material may also be a material of a hole injection layer, a material of a hole transporting layer, a material of an electron injection layer, a material of an electron transporting layer. Specifically, in an embodiment, the first organic material is the material of the hole injection layer, e.g., copper phthalocyanine, star-like arylamines, polyaniline (PAN), 3,4-polyethylene dioxythio phene (PEDT), or any other appropriate material. In another embodiment, the first organic material is the material of the hole transporting layer, e.g., triarylamine, 2,2-bis(trifluoromethyl)-4,4'-diaminobiphenyl (TFDB) with a crossing structure, TFDB derivatives, or any other appropriate material. In another embodiment, the first organic material is the material of the electron injection layer, e.g., lithium oxide, lithium boron oxide, potassium silica, cesium carbonate, sodium acetate, alkali lithium fluoride, or any other appropriate material. In another embodiment, the first organic material is the material of the electron transporting layer, e.g., oxazole derivatives and dendrites, chelate compound, azole compound, anthrazoline derivatives, silicon-containing heterocyclic ring compound, or any other appropriate material. The first solid medium includes naphthalene or aluminium acetylacetonate ($Al(acac)_3$), for instance. In the present embodiment, a sublimation temperature of the first solid medium under the atmospheric pressure is lower than 200° C., e.g., lower than 110° C. It should be mentioned that the sublimation temperature of the first solid medium is preferably lower than a tolerance temperature of the first organic material and lower than a tolerance temperature of each film already formed on the substrate 102, so as to protect the properties of the first organic material and the films from being negatively affected by the temperature at which the first solid medium is removed.

In the present embodiment, the first organic material and the first solid medium can be dissolved by the first solvent, such that the first organic material and the first solid medium are evenly mixed into the first solvent to form the first organic film solution. The first solvent is an organic solvent with volatility, such as tetrahydrofuran, dichloromethane, toluene, acetone, or any other appropriate solvent. Here, a volatile temperature of the first solvent is lower than the sublimation temperature of the first solid medium. Specifically, the volatile temperature of the first solvent ranges from 40° C. to 80° C., for instance.

Figure 2B:
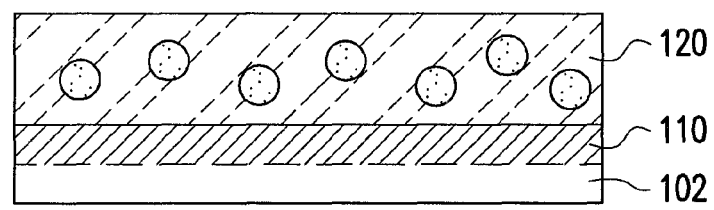

With reference to FIG. 2B, a first organic film 120 is formed on the first electrode layer 110 by using the aforesaid first organic film solution. In the present embodiment, a method of forming the first organic film 120 is, for instance, a coating method, such as a spin coating method, an inkjet method, and so forth. In this embodiment, the first organic film 120 is formed on the condition of lower water and oxygen, for instance.

Figure 2C:
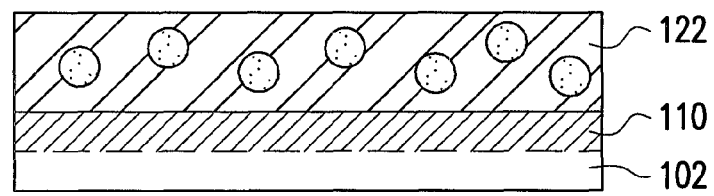
Figure 2D:
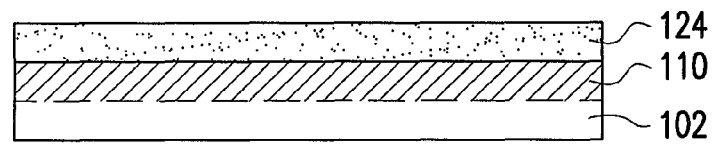

With reference to FIG. 2C and FIG. 2D, the first solvent and the first solid medium are removed to form a first organic functional layer 124 having the first organic material. As indicated in FIG. 2C, in the present embodiment, the first solvent in the first organic film 120 is removed first, so as to form a first solid film 122. The first solid film 122 includes the first organic material and the first solid medium. The ratio of the first organic material to the first solid medium is 1:5~1:200, preferably 1:100, for instance. In the present embodiment, a method of removing the first solvent is, for instance, evaporation of the solvent, such as performing a heating process, changing the pressure, or evaporating the solvent in other ways based on the properties of the first solvent. Here, the temperature at which the heating process is performed is determined by the volatile temperature of the first solvent. For instance, the heating process under the atmospheric pressure is performed at the temperature ranging from 40° C. to 80° C.

Next, as shown in FIG. 2D, the first solid medium is removed to form a first organic functional layer 124. In the present embodiment, a method of removing the first solid medium includes performing a heating process to sublimate the first solid medium in the first solid film 122, for instance. Thereby, the first organic functional layer 124 having the first organic material is formed. As provided in the present embodiment, said step is implemented in a vacuum oven, for instance, and the vacuum level in the vacuum oven and the temperature at which the heating process is performed are determined based on the sublimation temperature of the first solid medium. For instance, the pressure may range from the atmospheric pressure to $10^{-3}$ torr of vacuum level, and the temperature at which the heating process is performed may range from 70° C. to 200° C. In other embodiments, the first solid medium may also be sublimated by changing the pressure or modifying other conditions based on the properties of the first solid medium. According to the present embodiment, the first organic functional layer 124 is an organic light emitting layer, for instance.

Figure 2E:
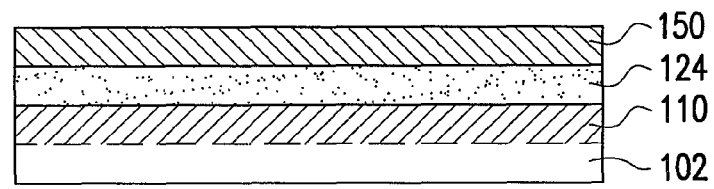

With reference to FIG. 2E, a second electrode layer 150 is formed on the first organic functional layer 124, so as to complete fabrication of the light emitting device 100. The second electrode layer 150 is a cathode, for instance, and a material and a forming method of the second electrode layer 150 are similar to those of the first electrode layer 110 and thus will not be reiterated herein. However, note that the condition of the first electrode layer 110 and second electrode layer 150 being respectively the anode and the cathode can be modified based on design requirements.

According to the present embodiment, the light emitting device 100 is an organic light emitting device and includes the substrate 102, the first electrode layer 110, the second electrode layer 150, and the first organic functional layer 124 located between the first electrode layer 110 and the second electrode layer 150. As described in the present embodiment, the first organic functional layer 124 acting as the organic light emitting layer is formed by using the first organic film solution, whereas the invention is not limited thereto. In other embodiments, a hole injection layer, a hole transporting layer, an electron injection layer, or an electron transporting layer can be formed by using the first organic film solution based on the first organic material of the first organic film solution. That is to say, the first organic film solution may be applied to form at least one of the hole injection layer, the hole transporting layer, the electron injection layer, the electron transporting layer, and the organic light emitting layer. It should be mentioned that people having ordinary skill in the art are all aware that the light emitting layer is one of the fundamental components in a light emitting device. Therefore, when the first organic functional layer 124 shown in FIG. 2E refers to another organic functional layer other than the organic light emitting layer, the light emitting device 100 substantially further includes an organic light emitting layer configured between the first organic functional layer 124 and one of the first electrode layer 110 and the second electrode layer 150.

According to the present embodiment, the solid medium is capable of sublimation and can be easily removed from the solid film by heating or in other manner, and the remaining organic functional layer merely contains the organic material. Accordingly, the use of the solid medium does not significantly increase costs and time of fabricating the light emitting device. What is more, the light emitting device formed thereby may have favorable device properties.

Third Embodiment

FIG. 3A to FIG. 3G are schematic cross-sectional flow charts illustrating a fabricating method of a light emitting device according to a third embodiment of the invention. In the present embodiment and the second embodiment, the organic functional layer is formed by using the organic film solution, while the difference between the two embodiments lies in that the first organic functional layer and the second organic functional layer stacked onto the first electrode layer are respectively formed by using the first organic film solution and a second organic film solution according to the present embodiment. Said difference is elaborated hereinafter. The materials of the substrate, the first electrode layer, and the second electrode layer, the forming method of said components, and the organic material, the solid medium, and the solvent of the organic film solution for forming another organic functional layer will not be further described below because the relevant descriptions can be found in the first embodiment.

Figure 3A:
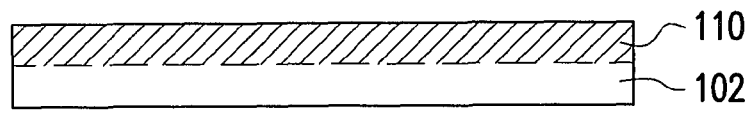
FIG. 3A to FIG. 3G are schematic cross-sectional flow charts illustrating a fabricating method of a light emitting device according to a third embodiment of the invention.

With reference to FIG. 3A, a substrate 102 having a first electrode layer 110 is provided. According to the present embodiment, the first electrode layer 110 is an anode, for instance.

A first organic film solution that includes a first organic material, a first solid medium, and a first solvent is provided. The first solid medium is capable of sublimation, and the first organic material and the first solid medium are mixed into the first solvent. In this embodiment, the first organic film solution is made on the conditions of normal temperature, atmospheric pressure, and lower water and oxygen. The first organic material is, for instance, selected from one of a material of a hole injection layer, a material of a hole transporting layer, a material of an organic light emitting layer, a material of an electron injection layer, and a material of an electron transporting layer. The first solid medium is naphthalene or aluminium acetylacetonate ($Al(acac)_3$), for instance. The first solvent is an organic solvent with volatility, such as tetrahydrofuran, dichloromethane, toluene, acetone, or any other appropriate solvent. The ratio of the first organic material to the first solid medium is 1:5~1:200, preferably 1:100, for instance. The ratio of the solid content of the first organic material to the solid content of the first solid medium in the first organic film solution is 10%~20%, for instance.

Figure 3B:
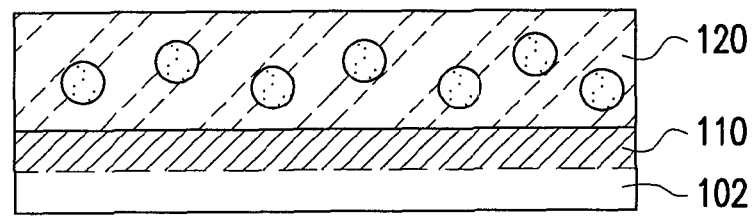

With reference to FIG. 3B, a first organic film 120 is formed on the first electrode layer 110 by using the aforesaid first organic film solution. In the present embodiment, a method of forming the first organic film 120 is, for instance, a coating method, such as a spin coating method, an inkjet method, and so forth. In this embodiment, the first organic film 120 is made on the condition of lower water and oxygen, for instance.

Figure 3C:
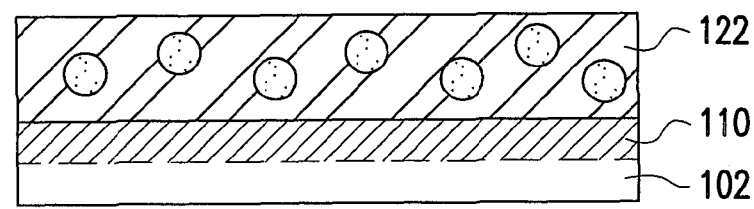

With reference to FIG. 3C, the first solvent is removed from the first organic film 120 to form a first solid film 122. The first solid film 122 includes the first organic material and the first solid medium. The ratio of the first organic material to the first solid medium is 1:5~1:200, preferably 1:100, for instance. In this embodiment, a method of removing the first solvent may include performing a heating process to evaporate the first solvent, for instance. The temperature at which the heating process is performed is determined by the volatile temperature of the first solvent. For instance, the heating process under the atmospheric pressure is performed at the temperature ranging from 40° C. to 80° C. In other embodiments, the first solvent may also be removed by changing the pressure or modifying other conditions based on the properties of the first solvent.

A second organic film solution that includes a second organic material, a second solid medium, and a second solvent is provided. The second solid medium is capable of sublimation, and the second organic material and the second solid medium are mixed into the second solvent. The second organic material is different from the first organic material, for instance. Specifically, in the present embodiment, the first organic material is, for instance, selected from one of a material of a hole injection layer, a material of a hole transporting layer, a material of an organic light emitting layer, a material of an electron injection layer, and a material of an electron transporting layer, while the second organic material is, for instance, selected from another one of the material of the hole injection layer, the material of the hole transporting layer, the material of the organic light emitting layer, the material of the electron injection layer, and the material of the electron transporting layer. According to the present embodiment, the first organic material is the material of the organic light emitting layer, and the second organic material is the material of the electron injection material.

The second solid medium and the first solid medium have similar or substantially the same sublimation temperature, for instance. In the present embodiment, the second solid medium is the same as the first solid medium, for instance. The second solid medium is naphthalene or aluminium acetylacetonate ($Al(acac)_3$), for instance. The second solvent is an organic solvent with volatility, such as tetrahydrofuran, dichloromethane, toluene, acetone, or any other appropriate solvent. The ratio of the second organic material to the second solid medium is 1:5~1:200, preferably 1:100, for instance. The ratio of the solid content of the second organic material to the solid content of the second solid medium in the second organic film solution is 10%~20%, for instance. In the present embodiment, the second organic film solution is made on the conditions of normal temperature, atmospheric pressure, and lower water and oxygen.

Figure 3D:
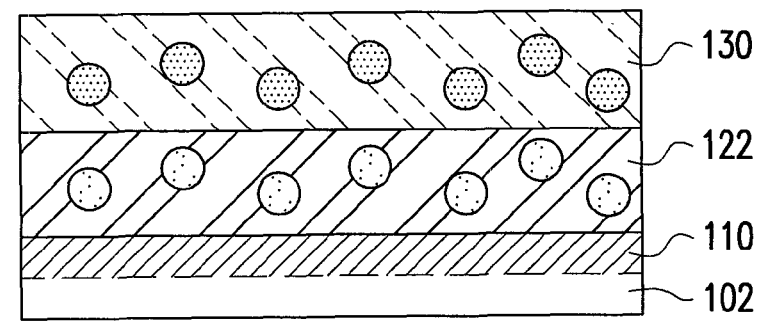

With reference to FIG. 3D, a second organic film 130 is formed on the first solid film 122 by using the second organic film solution. In the present embodiment, a method of forming the second organic film 130 is, for instance, a coating method, such as a spin coating method, an inkjet method, and so forth. In this embodiment, the second organic film 130 is made on the condition of lower water and oxygen, for instance.

Figure 3E:
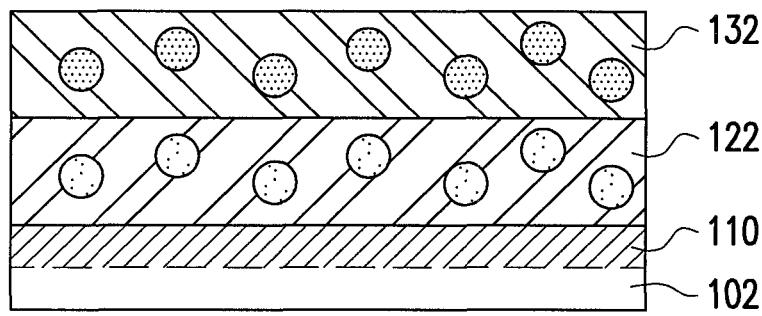

With reference to FIG. 3E, the second solvent is removed from the second organic film 130 to form a second solid film 132. The second solid film 132 includes the second organic material and the second solid medium. The ratio of the second organic material to the second solid medium is 1:5~1:200, preferably 1:100, for instance. In this embodiment, a method of removing the second solvent may include performing a heating process to evaporate the second solvent, for instance. The temperature at which the heating process is performed is determined by a volatile temperature of the second solvent, e.g., from 40° C. to 80° C. In other embodiments, the second solvent may also be evaporated by changing the pressure or modifying other conditions based on the properties of the second solvent.

Figure 3F:
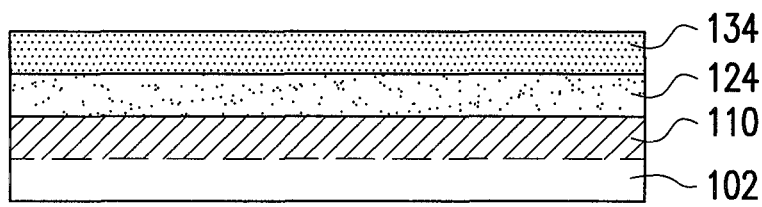

With reference to FIG. 3F, the first solid medium is removed from the first solid film 122 to form a first organic functional layer 124 having the first organic material; the second solid medium is removed from the second solid film 132 to form a second organic functional layer 134 having the second organic material. The first organic functional layer 124 includes the first organic material, and the second organic functional layer 134 includes the second organic material. Since the second solid medium and the first solid medium have similar or substantially the same sublimation temperature in the present embodiment, it is likely to sublimate both the first solid medium in the first solid film 122 and the second solid medium in the second solid film 132 in one heating step. As provided in the present embodiment, said step is implemented in a vacuum oven, for instance, and the vacuum level in the vacuum oven and the temperature at which the heating process is performed are determined based on the sublimation temperature of the first solid medium and the sublimation temperature of the second solid medium. For instance, the pressure may range from the atmospheric pressure to $10^{-3}$ torr of vacuum level, and the temperature at which the heating process is performed may range from 70° C. to 200° C. In other embodiments, the first solid medium and the second solid medium may also be sublimated by changing the pressure or modifying other conditions based on the properties of the first solid medium and the second solid medium. According to the present embodiment, the first organic functional layer 124 is an organic light emitting layer, for instance, and the second organic functional layer 134 is an electron injection layer, for instance, which should not be construed as limitations to the invention.

It should be mentioned that the first solid medium and the second solid medium are removed in the same step according to the present embodiment, for instance. However, in other embodiments, when the first solid medium and the second solid medium have different sublimation temperatures, the first solid medium in the first solid film 122 and the second solid medium in the second solid film 132 may also be removed in different steps. For instance, one of the first solid medium and the second solid medium with a lower sublimation temperature is removed first, and the other one with a higher sublimation temperature is then removed. Moreover, the second organic film 130 is formed on the first solid film 122 in the present embodiment; namely, the second organic film 130 is formed after the first solvent is removed and before the first solid medium is removed. In other embodiments, however, the first organic functional layer 124 is formed before forming the second organic film 130 on the first organic functional layer 124 and removing the second solvent and the second solid medium of the second organic film 130.

Figure 3G:
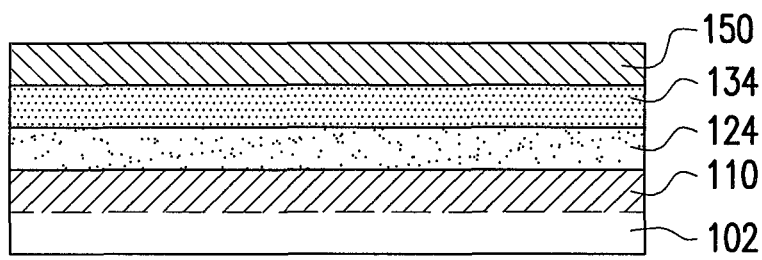

With reference to FIG. 3G, a second electrode layer 150 is formed on the second organic functional layer 134, so as to complete fabrication of the light emitting device 100a. The second electrode layer 150 is a cathode, for instance, and a material and a forming method of the second electrode layer 150 are similar to those described in the previous embodiment and thus will not be reiterated herein. According to the present embodiment, the light emitting device 100a is an organic light emitting device and includes the substrate 102, the first electrode layer 110, the second electrode layer 150, and the first organic functional layer 124 and the second organic functional layer 134 that are located between the first electrode layer 110 and the second electrode layer 150. It should be mentioned that people having ordinary skill in the art are all aware that the light emitting layer is one of the fundamental components in a light emitting device. Therefore, when the first organic functional layer 124 and the second organic functional layer 134 shown in FIG. 3G refer to other organic functional layers aside from the organic light emitting layers, the light emitting device 100a substantially further includes an organic light emitting layer.

According to the present embodiment, in the step of forming the second organic film 130 on the first solid film 122, the second organic solvent of the second organic film solution is in contact with the first solid film 122. Nonetheless, the second organic solvent is substantially in contact with the upper surface of the first solid film 122, and the first organic material in the first solid film 122 is substantially evenly distributed in the first solid medium and accounts for a relatively small proportion. Accordingly, the second organic solvent barely causes damages to or dissolves the first organic material in the first solid film 122. In other words, the solid medium in the solid film substantially serves as a medium that protects the organic material and prevents the properties of the organic material from being negatively affected; hence, in terms of selection of solvents, it is not necessary to consider whether the selected solvent and the previous film are mutually dissolvable and thus may affect each other, such that selection of solvents is much less complicated. Thereby, the fabricating method of the light emitting device in the embodiment is suitable for forming a plurality of organic functional layers stacked together, and each of the organic functional layers individually has favorable properties. In addition, the solid medium is capable of sublimation and can be easily removed from the solid film by heating or in other manner, and the remaining organic functional layer merely contains the organic material. Accordingly, the use of the solid medium does not significantly increase costs and time of fabricating the light emitting device. What is more, the light emitting device formed thereby may have favorable device properties.

Fourth Embodiment

FIG. 4A to FIG. 4G are schematic cross-sectional flow charts illustrating a fabricating method of a light emitting device according to a fourth embodiment of the invention. The fabricating method of the light emitting device described in the present embodiment is similar to that described in the third embodiment, while the difference therebetween is elaborated hereinafter. Other details of similar steps are described in the third embodiment and will not be reiterated below.

Figure 4A:
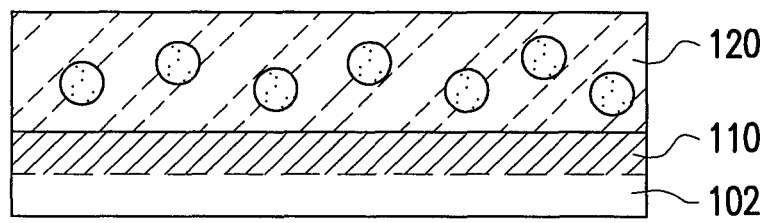
FIG. 4A to FIG. 4G are schematic cross-sectional flow charts illustrating a fabricating method of a light emitting device according to a fourth embodiment of the invention.

With reference to FIG. 4A, a substrate 102 having a first electrode layer 110 is provided. According to the present embodiment, the first electrode layer 110 is an anode, for instance. A first organic film 120 is formed on the first electrode layer 110 by using the first organic film solution.

Figure 4B:
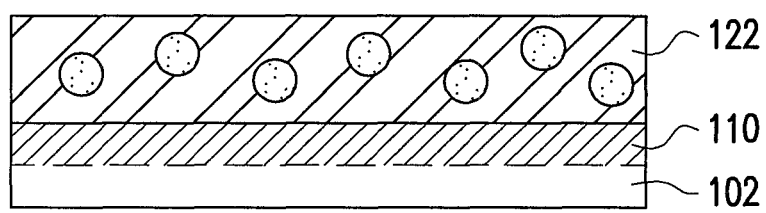

With reference to FIG. 4B, the first solvent is removed from the first organic film 120 to form a first solid film 122.

Figure 4C:
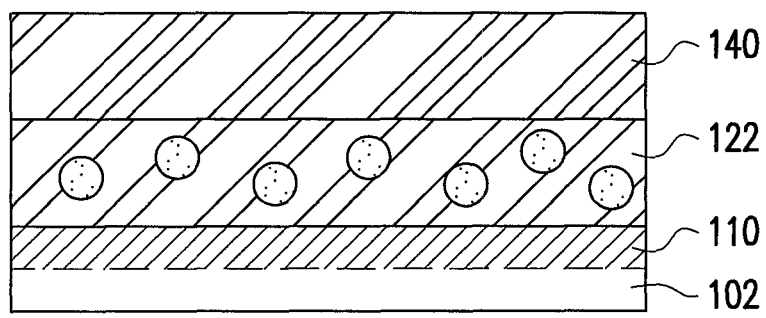

With reference to FIG. 4C, a buffer layer 140 is formed on the first solid film 122. The buffer layer 140 includes a third solid medium capable of sublimation. In the present embodiment, the third solid medium of the buffer layer 140 is naphthalene, aluminium acetylacetonate ($Al(acac)_3$), or any other appropriate solid medium, for instance.

Figure 4D:
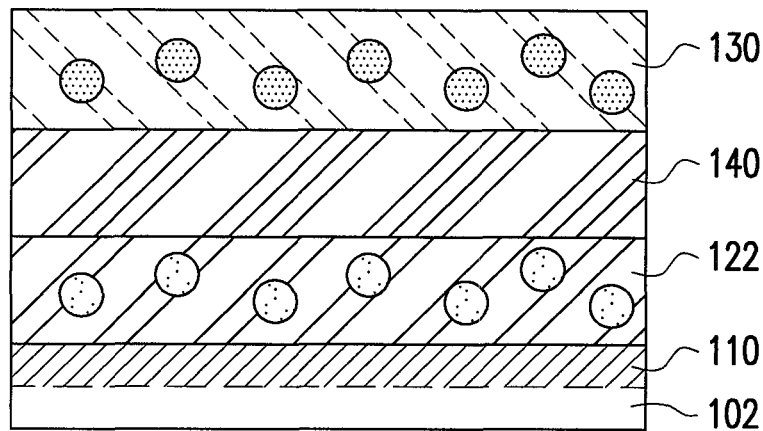

With reference to FIG. 4D, a second organic film 130 is formed on the buffer layer 140 by using the second organic film solution.

As provided in the present embodiment, the materials of the first solid medium of the first organic film 120, the second solid medium of the second organic film 130, and the third solid medium of the buffer layer 140 have similar or substantially the same sublimation temperature, for instance. The sublimation temperature of the third solid medium under the atmospheric pressure is lower than 200° C., e.g., lower than 110° C. according to the present embodiment. In particular, the sublimation temperature of the third solid medium is preferably lower than a tolerance temperature of each film already formed or to be formed on the substrate 102, so as to protect the device properties of each film in the light emitting device from being negatively affected by the temperature at which the third solid medium is removed.

Figure 4E:
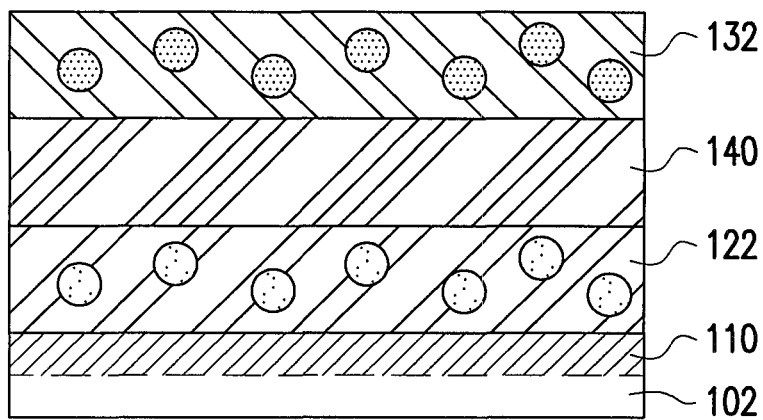

With reference to FIG. 4E, the second solvent is removed from the second organic film 130 to form a second solid film 132.

Figure 4F:
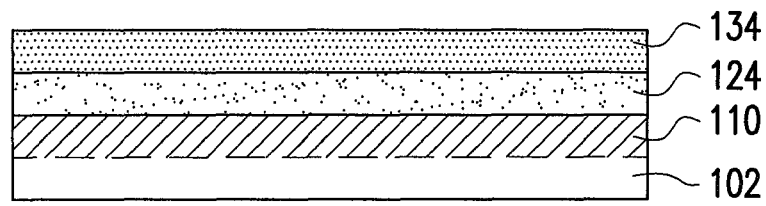

With reference to FIG. 4F, the first solid medium in the first solid film 122, the buffer layer 140, and the second solid medium in the second solid film 132 are removed to form a first organic functional layer 124 having the first organic material and form a second organic functional layer 134 having the second organic material. Since the materials of the first solid medium, the second solid medium, and the third solid medium have similar or substantially the same sublimation temperature in the present embodiment, it is likely to sublimate the first solid medium in the first solid film 122, the third solid medium constituting the buffer layer 140, and the second solid medium in the second solid film 132 in one heating step, for instance. As provided in the present embodiment, said step is implemented in a vacuum oven, for instance, and the vacuum level in the vacuum oven and the temperature at which the heating process is performed are determined based on the sublimation temperature of the first solid medium, the sublimation temperature of the second solid medium, and the sublimation temperature of the third solid medium. For instance, the pressure may range from the normal pressure atmospheric pressure to $10^{-3}$ torr of vacuum level, and the temperature at which the heating process is performed may range from 70° C. to 200° C. In other embodiments, the first solid medium, the second solid medium, and the third solid medium may also be sublimated by changing the pressure or modifying other conditions based on the properties of the first solid medium, the second solid medium, and the third solid medium.

Figure 4G:
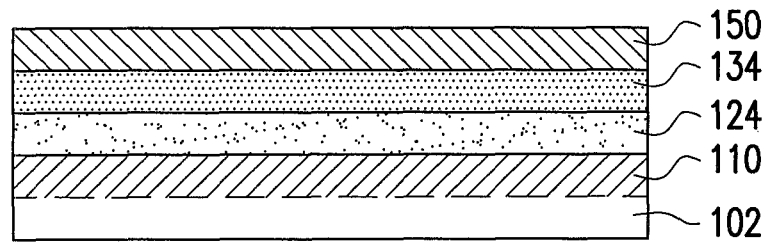

With reference to FIG. 4G, a second electrode layer 150 is formed on the second organic functional layer 134, so as to complete fabrication of the light emitting device 100b. According to the present embodiment, the second electrode layer 150 is a cathode, for instance. In the present embodiment, the light emitting device 100b is an organic light emitting device and includes the substrate 102, the first electrode layer 110, the second electrode layer 150, and the first organic functional layer 124 and the second organic functional layer 134 that are located between the first electrode layer 110 and the second electrode layer 150. The first organic functional layer 124 and the second organic functional layer 134 may be made of any two of a material of a hole injection layer, a material of a hole transporting layer, a material of an organic light emitting layer, a material of an electron injection layer, and a material of an electron transporting layer.

According to the present embodiment, the buffer layer 140 formed on the first solid film 122 effectively prevents the solvent in the second organic film solution from contacting the first organic material in the first solid film 122, so as to preclude the first organic material from being damaged or dissolved by the second solvent. Hence, in terms of selection of solvents, it is not necessary to consider whether the selected solvent and the previous film are mutually dissolvable and may affect each other, such that selection of solvents is much less complicated. Thereby, the fabricating method of the light emitting device in the present embodiment is suitable for forming a plurality of organic functional layers stacked together, and each of the organic functional layers individually has favorable properties. In particular, the buffer layer 140 is made of the solid medium capable of sublimation, the buffer layer 140 can be easily removed by heating or in other manner, and the first organic functional layer 124 and the second organic functional layer 134 stacked to and contacted with each other are left. Besides, if the first solid medium, the second solid medium, and the third solid medium have similar sublimation temperature, the first solid medium, the second solid medium, and the third solid medium may be removed in the same step, so as to simultaneously form the first and second organic functional layers 124 and 134 and remove the buffer layer 140. Accordingly, the configuration of the buffer layer 140 does not significantly increase costs and time of fabricating the organic functional layers. What is more, the organic functional layers 124 and 134 formed thereby may accomplish desirable functions, and the light emitting device 100b having the organic functional layers 124 and 134 may have favorable device properties.

Note that the light emitting device described in the previous embodiments has two exemplary organic functional layers, which should however not be construed as a limitation to the invention. Namely, in other embodiments, the light emitting device may have two or more organic functional layers formed by applying the aforesaid method, and the buffer layer may be temporarily configured between the films formed by applying said method. What is more, in the light emitting device described in another embodiment, at least one organic functional layer is formed by using said organic film solution, while other organic functional layers are formed in a conventional way, e.g., performing a film coating process. In other words, the forming method of the organic layer in the invention may be combined with the existing manufacturing process based on actual demands and should not be construed as limited to the embodiments described above. Besides, in another embodiment, the solid film containing the organic material may be formed on the substrate, and the solid film is transferred and printed onto the first electrode layer already formed on the substrate. The solid medium in the solid film is then removed to form the organic functional layer (having the organic material) on the first electrode layer. That is to say, the forming method of the organic layer may also be combined with a transfer printing technique to form the organic functional layer in a light emitting device.

Experiments are conducted to verify the effects achieved in the invention. To prove the feasibility of the fabricating method of the light emitting device described in the previous embodiments, experimental examples and comparison examples are provided below.

First, in a light emitting inspection experiment, it is observed whether light emitting devices of experimental examples 1 and 2 formed by applying the fabricating method of the invention can actually emit light.

The fabricating method of the light emitting device of the comparison example 1 includes sequentially forming on a substrate: (1a) an anode, a material thereof including indium tin oxide (ITO); (1b) a hole injection layer, a material thereof including Poly(3,4-ethylenedioxythiophene): poly(styrenesulfonate) (PEDOT: PSS), the hole injection layer being formed on the anode through coating; (1c) an organic light emitting layer formed by coating the hole injection layer with an organic film solution containing Tris(8-hydroxyquinolinato)aluminium (Alq3) and toluene and then removing toluene; (1d) an electron transporting layer, a material thereof including N-arylbenzimidazole (TPBi), the electron transporting layer being formed on the organic light emitting layer through evaporation; and (1e) a cathode, a material thereof including aluminum (Al), the cathode being formed on the electron transporting layer through evaporation.

The fabricating method of the light emitting device of the experimental example 1 includes sequentially forming an anode, a hole injection layer, an organic light emitting layer, an electron transporting layer, and a cathode on the substrate. Here, the fabricating methods of the anode, the hole injection layer, the electron transporting layer, and the cathode described in the experimental example 1 are the same as those described in the comparison example 1. The organic light emitting layer is formed by applying the forming method of the invention. In detail, an organic film solution containing Alq3, naphthalene, and toluene is coated onto the hole injection layer, and toluene and naphthalene are sequentially removed to form the organic light emitting layer containing Alq3.

The fabricating method of the light emitting device of the experimental example 2 includes sequentially forming an anode, a hole injection layer, an organic light emitting layer, a buffer layer, an electron transporting layer, and a cathode. Here, the fabricating methods of the anode, the hole injection layer, and the cathode described in the experimental example 2 are the same as those in the comparison example 1. The organic light emitting layer, the buffer layer, and the electron transporting layer are formed by the forming method provided in the invention, as described below. First, an organic film solution containing Alq3, naphthalene, and toluene is coated onto the hole injection layer, and toluene is then removed to form a first solid film. A buffer layer containing naphthalene is formed on the first solid film through coating. An organic film solution containing TPBi, naphthalene, and toluene is coated onto the buffer layer, and toluene is then removed to form a second solid film. After that, a heating process is performed at 80° C. under the atmospheric pressure to remove the naphthalene in the first and second solid films and the naphthalene constituting the buffer layer, so as to form the organic light emitting layer and the electron transporting layer that are stacked together.

Table 1 indicates the light emitting inspection results of the light emitting device in the experimental examples 1, 2, and the comparison example 1. In columns of Table 1, "O" denotes light emission, while "X" denotes absence of light emission.

TABLE 1

| Group | Experimental Example 1 | Experimental Example 2 | Comparison Example 1 |
|---|---|---|---|
| Light Emission | O | O | O |

It can be learned from Table 1 that the light emitting devices of the experimental examples 1 and 2, formed by the method according to the invention, are able to emit light, which proves the feasibility of the fabricating method of the light emitting device in the invention.

Comparison examples 2 and 3 are provided to learn whether an organic film solution not containing the solid medium is able to be stacked. As to the comparison example 2, an organic blue light emitting material solution containing Alq3 and a solvent is coated onto a blank substrate, and the measured thickness of the solution is 478 angstroms. As to the comparison example 3, an organic blue light emitting material solution containing Alq3 and a solvent is coated onto a substrate where an organic green light emitting layer (with the thickness of 320 angstroms) is already formed, and the measured thickness of the solution is 480 angstroms. The organic blue light emitting material solution in the comparison examples 2 and 3 is identical, and a method of coating the organic blue light emitting material solution is performed at 1000 rpm for 30 seconds.

According to the thickness measured in the comparison examples 2 and 3, the organic blue light emitting layer formed by coating the organic blue light emitting material solution and the organic green light emitting layer already formed are not able to be stacked together.

Experimental examples 3, 4, and 5 are provided to verify whether solid layers containing the solid medium are able to be stacked together and whether the buffer layer formed by the solid medium is removable during sublimation. As to the fabricating method described in the experimental example 3, an organic green light emitting material solution containing Alq3, toluene, and naphthalene is coated onto a substrate, and toluene and naphthalene are then sequentially removed to form an organic green light emitting layer. A thickness of the organic green light emitting layer is measured. As to the fabricating method described in the experimental example 4, an organic green light emitting material solution containing Alq3, toluene, and naphthalene is coated onto a substrate, and toluene is then removed to form an organic green light emitting solid layer. An organic blue light emitting material solution containing N,N'-bis-(1-naphthyl)-N,N'-diphenyl-1,1'-biphenyl-4-4'-diamine (NPB), toluene, and naphthalene is coated onto the organic green light emitting solid layer, and toluene is then removed to form an organic blue light emitting solid layer. Naphthalene in the organic green light emitting solid layer and naphthalene in the organic blue light emitting solid layer are removed, so as to form the organic green light emitting layer and the organic blue light emitting layer stacked together. A total thickness of the stacked organic green light emitting layer and organic blue light emitting layer is measured.

The fabricating method in the experimental example 5 is substantially the same as that in the experimental example 4, while the main difference lies in that a buffer layer containing naphthalene is formed on the organic green light emitting solid layer, an organic blue light emitting solid layer is formed on the buffer layer, and naphthalene in the organic green light emitting solid layer, the organic blue light emitting solid layer, and the buffer layer is removed in the experimental example 5. A total thickness of the stacked organic green light emitting layer and organic blue light emitting layer is measured. In the experimental examples 3~5, manufacturing conditions including the volatile temperature of the solvent, the conditions of coating the organic light emitting material solution (i.e., the organic green light emitting material solution is coated at 500 rpm for 5 seconds, and the organic blue light emitting material solution is coated at 1000 rpm for 20 seconds for three times), and the sublimation temperature are identical.

The thickness of the organic green light emitting layer in the experimental example 3 is 135 angstroms, the total thickness of the organic green light emitting layer and the organic blue light emitting layer in the experimental example 4 is 563.4 angstroms, and the total thickness of the organic green light emitting layer and the organic blue light emitting layer in the experimental example 5 is 558 angstroms. It can be deduced from the experimental examples 3 and 4 that the organic green light emitting material solution containing the solid medium and the organic blue light emitting material solution containing the solid medium can be stacked together.

In addition, it can be deduced from the experimental examples 4 and 5 that the solid medium in the buffer layer can be removed during sublimation and is barely left between the organic blue light emitting layer and the organic green light emitting layer. Hence, the organic light emitting material solution containing the solid medium can be stacked, and the fabricating method of the light emitting device including steps of forming the buffer layer (having the solid medium) among the organic functional layers and subsequently removing the buffer layer is feasible as a matter of fact.

In light of the foregoing, according to the embodiments of the invention, the organic film solution that contains the organic material, the solid medium capable of sublimation, and the solvent is employed to form the organic film. After the solvent and the solid medium are removed, the organic functional layer having the organic material or the organic layer having the organic material is formed. Thereby, the fabricating process of the organic functional layer or that of the organic layer can be simplified.

Specifically, in an embodiment of the invention, the organic material is evenly distributed in the solid medium and accounts for a relatively small proportion. Hence, when it is intended to form two organic functional layers that are contacted with and stacked to each other, the solid medium significantly reduces the possibility that the organic material is in direct contact with another solvent coated onto the organic material subsequently, so as to prevent damages to the organic material. Moreover, in an embodiment of the invention, the buffer layer containing the solid medium may be further formed between two organic films, so as to prevent the organic material from being in direct contact with another solvent coated onto the organic material subsequently. In addition, the buffer layer can be removed when the solid medium is removed from the solid film. Since the solid medium is capable of sublimation, it is easy to remove both the solid medium from the solid film and the buffer layer formed by the solid medium, and the remaining organic functional layer merely contains the organic material. Accordingly, the issue of complexity arising from selection of solvents of two organic films can be resolved to a great extent, and the use of solid medium does not significantly increase costs and time of fabricating the organic functional layers. What is more, the light emitting device formed thereby may have favorable device properties.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A fabricating method of a light emitting device, comprising:
   providing a substrate, the substrate comprising a first electrode layer;
   providing a first organic film solution, the first organic film solution comprising a first organic material, a first solid medium, and a first solvent, wherein the first solid medium is sublimated under the atmospheric pressure at a sublimation temperature lower than 110° C., and the first organic material and the first solid medium are mixed into the first solvent;
   disposing the first organic film solution on the first electrode layer;
   forming a first organic film on the first electrode layer;
   removing the first solvent in the first organic film to form a first solid film;
   providing a second organic film solution, the second organic film solution comprising a second organic material, a second solid medium, and a second solvent, wherein the second solid medium is sublimated under the atmospheric pressure at a sublimation temperature lower than 110° C., and the second organic material and the second solid medium are mixed into the second solvent;
   forming a second organic film on the first solid film by using the second organic film solution;
   removing the second solvent in the second organic film to form a second solid film;
   removing the first solid medium to form a first organic functional layer having the first organic material;
   removing the second solid medium to form a second organic functional layer having the second organic material; and
   forming a second electrode layer on the second organic functional layer.

2. The fabricating method as recited in claim 1, wherein the first solid medium comprises naphthalene or aluminium acetylacetonate (Al(acac)3).

3. The fabricating method as recited in claim 1, wherein the first organic material comprises a material of a hole injection layer, a material of a hole transporting layer, a material of an electron injection layer, a material of an electron transporting layer, or a material of an organic light emitting layer.

4. The fabricating method as recited in claim 1, wherein the first organic functional layer comprises a hole injection layer, a hole transporting layer, an electron injection layer, an electron transporting layer, or an organic light emitting layer.

5. The fabricating method as recited in claim 1, wherein the first solvent comprises tetrahydrofuran, dichloromethane, toluene, or acetone.

6. The fabricating method as recited in claim 1, wherein the first solid medium in the first solid film and the second solid medium in the second solid film are sublimated in one heating step.

7. The fabricating method as recited in claim 1, wherein the second organic material is different from the first organic material.

8. The fabricating method as recited in claim 1, wherein the sublimation temperature of the first solid medium is substantially the same as the sublimation temperature of the second solid medium.

9. The fabricating method as recited in claim 1, wherein the first organic functional layer and the second organic functional layer are selected from any two of a hole injection layer, a hole transporting layer, an organic light emitting layer, an electron injection layer, and an electron transporting layer.

10. The fabricating method as recited in claim 1, further comprising forming a buffer layer on the first solid film before forming the second organic film, wherein the second organic film solution is formed on the buffer layer to form the second organic film, the buffer layer includes a third solid medium, and the third solid medium is sublimated under the atmospheric pressure at a sublimation temperature lower than 110° C.

11. The fabricating method as recited in claim 10, wherein the sublimation temperature of the first solid medium, the sublimation temperature of the second solid medium, and the sublimation temperature of the third solid medium are substantially the same.

12. The fabricating method as recited in claim 10, wherein the first solid medium, the second solid medium, and the third solid medium are sublimated in one heating step.

13. The fabricating method as recited in claim 1, wherein a method of forming the first organic film on the first electrode layer comprises coating the first electrode layer with the first organic film solution.

14. The fabricating method as recited in claim 13, wherein a method of coating the first electrode layer with the first organic film solution comprises a spin coating method or an inkjet method.

15. The fabricating method as recited in claim 2, wherein the step of removing the first solid medium comprises:
   removing the first solid medium by sublimation at a temperature and a pressure appropriate for the sublimation of naphthalene or aluminium acetylacetonate.

* * * * *